(12) United States Patent
Ausschnitt et al.

(10) Patent No.: US 8,107,079 B2
(45) Date of Patent: *Jan. 31, 2012

(54) MULTI LAYER ALIGNMENT AND OVERLAY TARGET AND MEASUREMENT METHOD

(75) Inventors: Christopher P. Ausschnitt, Lexington, MA (US); Lewis A. Binns, York (GB); Jaime D. Morillo, Beacon, NY (US); Nigel P. Smith, Hsinchu (TW)

(73) Assignees: International Business Machines Corporation, Armonk, NY (US); Nanometrics Incorporated, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/942,398

(22) Filed: Nov. 9, 2010

(65) Prior Publication Data

US 2011/0058170 A1  Mar. 10, 2011

Related U.S. Application Data

(63) Continuation of application No. 12/144,023, filed on Jun. 23, 2008, now Pat. No. 7,876,439, which is a continuation of application No. 11/162,506, filed on Sep. 13, 2005, now Pat. No. 7,474,401.

(51) Int. Cl.
| | |
|---|---|
| *G01B 11/00* | (2006.01) |
| *G03F 9/00* | (2006.01) |
| *G03C 5/00* | (2006.01) |
| *H01L 23/544* | (2006.01) |
| *H01L 21/76* | (2006.01) |

(52) U.S. Cl. ............ 356/401; 430/22; 430/30; 257/797; 438/401

(58) Field of Classification Search .................. None
See application file for complete search history.

(56) References Cited

U.S. PATENT DOCUMENTS 4,166,219 A   8/1979  Ausschnitt et al.
(Continued)

FOREIGN PATENT DOCUMENTS

JP          61-168227           7/1986
(Continued)

OTHER PUBLICATIONS

Starikov, Alexander; "Exposure Monitor Structure" Integrated Circuit Metrology, Inspection and Process Control IV, 1990, pp. 315-324.

(Continued)

*Primary Examiner* — Gordon Stock, Jr.
(74) *Attorney, Agent, or Firm* — DeLin & Peterson, LLC; Kelly M. Nowak; Ian D. Mackinnon

(57) ABSTRACT

A target system for determining positioning error between lithographically produced integrated circuit fields on at least one lithographic level. The target system includes a first target pattern on a lithographic field containing an integrated circuit pattern, with the first target pattern comprising a plurality of sub-patterns symmetric about a first target pattern center and at a same first distance from the first target pattern center. The target system also includes a second target pattern on a different lithographic field, with the second target pattern comprising a plurality of sub-patterns symmetric about a second target pattern center and at a same second distance from the second target pattern center. The second target pattern center is intended to be at the same location as the first target pattern center. The centers of the first and second target patterns may be determined and compared to determine positioning error between the lithographic fields.

19 Claims, 7 Drawing Sheets

U.S. PATENT DOCUMENTS

| | | |
|---|---|---|
| 4,290,384 A | 9/1981 | Ausschnitt et al. |
| 4,437,760 A | 3/1984 | Ausschnitt |
| 4,538,105 A | 8/1985 | Ausschnitt |
| 4,568,189 A | 2/1986 | Bass et al. |
| 4,848,911 A | 7/1989 | Uchida et al. |
| 4,890,239 A | 12/1989 | Ausschnitt et al. |
| 5,300,786 A | 4/1994 | Brunner et al. |
| 5,343,292 A | 8/1994 | Brueck et al. |
| 5,545,593 A | 8/1996 | Watkins et al. |
| 5,629,772 A | 5/1997 | Ausschnitt |
| 5,712,707 A | 1/1998 | Ausschnitt |
| 5,731,877 A | 3/1998 | Ausschnitt |
| 5,756,242 A | 5/1998 | Koizumi et al. |
| 5,757,507 A | 5/1998 | Ausschnitt et al. |
| 5,776,645 A | 7/1998 | Barr et al. |
| 5,790,254 A | 8/1998 | Ausschnitt |
| 5,805,290 A | 9/1998 | Ausschnitt et al. |
| 5,877,861 A | 3/1999 | Ausschnitt et al. |
| 5,914,784 A | 6/1999 | Ausschnitt et al. |
| 5,928,822 A | 7/1999 | Rhyu |
| 5,949,547 A | 9/1999 | Tseng et al. |
| 5,952,134 A | 9/1999 | Hwang |
| 5,953,128 A | 9/1999 | Ausschnitt et al. |
| 5,965,309 A | 10/1999 | Ausschnitt et al. |
| 5,968,693 A | 10/1999 | Adams |
| 5,976,740 A | 11/1999 | Ausschnitt et al. |
| 5,981,119 A | 11/1999 | Adams |
| 5,985,495 A | 11/1999 | Okumura et al. |
| 6,003,223 A | 12/1999 | Hagen et al. |
| 6,004,706 A | 12/1999 | Ausschnitt et al. |
| 6,020,966 A | 2/2000 | Ausschnitt et al. |
| 6,027,842 A | 2/2000 | Ausschnitt et al. |
| 6,042,976 A | 3/2000 | Chiang et al. |
| 6,061,119 A | 5/2000 | Ota |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,183,919 B1 | 2/2001 | Ausschnitt et al. |
| 6,317,211 B1 | 11/2001 | Ausschnitt et al. |
| 6,335,151 B1 | 1/2002 | Ausschnitt et al. |
| 6,346,979 B1 | 2/2002 | Ausschnitt et al. |
| 6,350,548 B1 | 2/2002 | Leidy et al. |
| 6,417,929 B1 | 7/2002 | Ausschnitt et al. |
| 6,429,667 B1 | 8/2002 | Ausschnitt et al. |
| 6,457,169 B1 | 9/2002 | Ross |
| 6,460,265 B2 | 10/2002 | Pogge et al. |
| 6,612,159 B1 | 9/2003 | Knutrud |
| 6,638,671 B2 | 10/2003 | Ausschnitt |
| 6,766,211 B1 | 7/2004 | Ausschnitt |
| 6,803,995 B2 | 10/2004 | Ausschnitt |
| 6,842,237 B2 | 1/2005 | Ausschnitt et al. |
| 6,869,739 B1 | 3/2005 | Ausschnitt et al. |
| 6,879,400 B2 | 4/2005 | Ausschnitt et al. |
| 6,937,337 B2 | 8/2005 | Ausschnitt et al. |
| 6,975,398 B2 | 12/2005 | Ausschnitt et al. |
| 7,019,836 B2 | 3/2006 | Mishima |
| 7,042,551 B2 | 5/2006 | Ausschnitt |
| 7,126,669 B2 | 10/2006 | Edart |
| 7,180,593 B2 | 2/2007 | Lin |
| 7,336,352 B2 | 2/2008 | Tanala |
| 7,346,878 B1 | 3/2008 | Cohen et al. |
| 7,359,054 B2 | 4/2008 | Ausschnitt et al. |
| 7,379,184 B2 * | 5/2008 | Smith et al. .................. 356/401 |
| 7,473,502 B1 | 1/2009 | Ausschnitt et al. |
| 7,474,401 B2 | 1/2009 | Ausschnitt et al. |
| 7,876,439 B2 * | 1/2011 | Ausschnitt et al. .......... 356/401 |
| 7,879,515 B2 * | 2/2011 | Ausschnitt et al. ............ 430/22 |
| 2001/0001900 A1 | 5/2001 | Pogge et al. |
| 2002/0097399 A1 | 7/2002 | Ausschnitt et al. |
| 2003/0053057 A1 | 3/2003 | Mishima |
| 2003/0071997 A1 | 4/2003 | Ausschnitt et al. |
| 2003/0077527 A1 | 4/2003 | Ausschnitt et al. |
| 2003/0123052 A1 | 7/2003 | Ausschnitt et al. |
| 2006/0139596 A1 | 6/2006 | Edart |
| 2007/0058169 A1 | 3/2007 | Ausschnitt et al. |
| 2009/0186286 A1 | 7/2009 | Ausschnitt et al. |
| 2010/0190096 A1 | 7/2010 | Ausschnitt et al. |

FOREIGN PATENT DOCUMENTS

| | | |
|---|---|---|
| JP | 61-170032 | 7/1986 |
| JP | 01214117 | 8/1989 |
| JP | 2-260441 | 10/1990 |
| JP | 05127364 | 5/1993 |
| JP | 10-213895 | 8/1998 |
| JP | 11095407 | 4/1999 |
| WO | WO02/19415 | 3/2002 |

OTHER PUBLICATIONS

"Method for Measuring Semiconductor Lithographic Tool Focus and Exposure", IBM Technical Disclosure Bulletin, Jul. 1987, 2 pages.

Ausschnitt, Christopher P., Cheng, Shaunee Y.; "Modeling for Profile-Based Process-Window Metrology", SPIE5378-5, Feb. 26, 2004, pp. 1-6.

Binns, L.A. et al., Nanometrics; Ausschnitt, C.P., et al. IBM SDRC; "Overlay Metrology Tool Calibration", Proc. SPIE 6518 (2007), 8 pages.

Binns, L.A. et al., Nanometrics; Ausschnitt, C.P., et al. IBM SDRC; "Overlay Metrology Tool Calibration", Proc. SPIE 6518 (2007), 19 pages.

Raugh, Michael R., "Self-calibration of Interferometer Stages: Mathematical Techniques for Deriving Lattice Algorithms for Nanotechnology"; Mar. 2002 (rev. Aug. 2003), 66 pages.

\* cited by examiner

Prior Art

MULTI LAYER ALIGNMENT AND OVERLAY TARGET AND MEASUREMENT METHOD

This application is a continuation of U.S. Ser. No. 12/144,023 filed on Jun. 23, 2008 which is a continuation of U.S. Ser. No. 11/162,506 filed on Sep. 13, 2005.

BACKGROUND OF THE INVENTION

1. Field of the Invention

The present invention relates to the manufacture of integrated circuits and, in particular, to a method and system for determining alignment or overlay error of integrated circuit fields within and between circuit layers made by a lithographic process.

2. Description of Related Art

Semiconductor manufacturing requires the sequential patterning of process layers on a single semiconductor wafer. Exposure tools known as steppers print multiple integrated circuit patterns or fields (also known as product cells) by lithographic methods on successive layers of the wafer. These steppers typically pattern different layers by applying step and repeat lithographic exposure or step and scan lithographic exposure in which the full area of the wafer is patterned by sequential exposure of the stepper fields containing one or more integrated circuits. Typically, 20-50 layers are required to create an integrated circuit. In some cases, multiple masks are required to pattern a single layer.

For the purposes of this application, the "alignment" and "overlay" of sequential patterning steps are distinguished as follows. Alignment is the position of an existing wafer target with respect to the exposure tool. Alignment error is the deviation of the location of the wafer target from its designed location, as determined by the alignment system of the exposure tool. Alignment to an existing layer (the aligned-to layer) is followed by the exposure that prints a new layer. On the other hand, overlay is the relative position among two or more patterns produced by successive exposures; most commonly, the relative position of the current layer and the aligned-to layer. Overlay error is the deviation of the relative position among patterns from their designed relative positions, as determined by an overlay metrology tool. To ensure circuit functionality, overlay errors must be minimized among all wafer patterns, consistent with the ground rules of the most critical circuit devices. As a rule of thumb, the overlay error between any pair of layers must be less than 40% of the minimum dimension. Thus, acceptable yield at the 70 nm node implies a layer-to-layer overlay tolerance of less than 30 nm. Achievement of such tight overlay tolerances over 300 mm wafers requires control of both layer-to-layer and within-layer overlay error, as described in U.S. Pat. Nos. 5,877,861 and 6,638,671.

Alignment and overlay both require specialized targets on each layer. The targets are placed in inactive areas of the wafer, either within the chip boundary or in the narrow dicing channel (kerf) that separates adjacent chips. In principle, alignment could use the prior layer components of the overlay target as align-to patterns. In practice, alignment and overlay metrology systems often require different target designs and locations. Overlay targets can be comprised of sub-patterns from both the same and different masks. The images are analyzed to determine the relative layer-to-layer and within-layer placement of the sub-patterns among the various mask layers printed on the wafer. Each determination of overlay error requires paired sub-patterns within a target whose relative position can be measured. From the overlay measurement perspective, therefore, the effective number of layers can be double the number of masks used in the patterning process. For this technical specification, the term layer is defined as any patterning step that requires a unique set of overlay sub-patterns.

The conventional nested box, frame or bar target used on successive lithographic layers A, B and C, as illustrated in FIG. 1, makes inefficient use of space, since relatively few can fit in the image field of view (FOV), and does not minimize proximity effects. Furthermore, successive layers A, B, and C are unequally represented by pattern length. Grating targets used on successive lithographic layers A and B, such as those shown in FIG. 2, are not optimized for nested or symmetric array layout.

Ideally, a target system to determine alignment and overlay error between lithographically produced integrated circuit fields on the same or different lithographic levels would be able to measure alignment and overlay error among many of the lithographic levels required to create an integrated circuit, and do so using a minimum of wafer surface area.

SUMMARY OF THE INVENTION

Bearing in mind the problems and deficiencies of the prior art, it is therefore an object of the present invention to provide a method and target system for determining and minimizing overlay error within the same or among many lithographic levels required to create an integrated circuit.

It is another object of the present invention to provide a multi-level lithographic target system that uses a minimum amount of wafer surface area.

A further object of the invention is to provide a multi-level lithographic target system that uses a common metrology recipe and sampling across multiple layers.

It is yet another object of the present invention to provide a multi-level lithographic target system that efficiently utilizes the field of view of the alignment system or overlay metrology tool.

Still other objects and advantages of the invention will in part be obvious and will in part be apparent from the specification.

The above and other objects, which will be apparent to those skilled in art, are achieved in the present invention which is directed to a target system for determining positioning error between lithographically produced integrated circuit fields on at least one lithographic level. The target system includes a first target pattern on a lithographic field containing an integrated circuit pattern, with the first target pattern comprising a plurality of sub-patterns symmetric about a first target pattern center and at a same first distance from the first target pattern center. The target system also includes a second target pattern on a different lithographic field containing an integrated circuit pattern, with the second target pattern comprising a plurality of sub-patterns symmetric about a second target pattern center and at a same second distance from the second target pattern center. The second target pattern center is intended to be at the same location as the first target pattern center. The second distance is the same as or different from the first distance, and the sub-patterns of the second target pattern are substantially non-overlapping with the sub-patterns of the first target pattern. The center of the first target pattern and the center of the second target pattern may be determined and compared to determine positioning error between the lithographic fields.

The target patterns may be created on the lithographic fields on the same lithographic level or on different lithographic levels. The target patterns may be located at corners of a geometric shape, such as a square.

The target system may further include, on a same lithographic level or on a different lithographic level, a pattern central to a target pattern of the lithographic level, the central pattern being different from the sub-patterns.

The sub-patterns may comprise elements symmetric about x- and y-axes. The sub-patterns may form a cross shape having an open center, and the cross shape may have arms comprising a single element or a plurality of elements. The elements of each sub-pattern may be used to determine centers of the sub-patterns, and the sub-pattern centers may be used to determine the target pattern centers.

If the center of the first target pattern is considered to be at the origin of an orthogonal grid of pitch p, the sub-patterns of the first target pattern may have coordinates of:

(−M, N)p, (N, M)p, (M, −N)p and (−N, −M)p, where N and M are integers, and the distance of each first target subpattern from the center of the first target pattern is defined by the equation:

$$r = p\sqrt{(N^2 + M^2)},$$

and wherein the sub-patterns of the second target pattern may have coordinates of:

(−M+m, N+n)p, (N+n, M+m)p, (M+m, −N+n)p and (−N+n, −M+m)p, where n and m are integers, and $$|n| + |m| = 2i,$$

where i is an integer.

In another aspect, the present invention is directed to a method of determining positioning error between lithographically produced integrated circuit fields on at least one lithographic level. The method includes first creating the target patterns described above. The method then comprises determining the center of the first target pattern and the center of the second target pattern, and measuring positioning error between the lithographic fields by comparing locations of the first target pattern center and the second target pattern center.

The method may further include creating at least one additional target pattern on at least one additional lithographic level. The at least one additional target pattern comprises a plurality of sub-patterns symmetric about an additional target pattern center and at a same distance from the additional target pattern center. The additional target pattern center is intended to be at the same location as the first and second target pattern centers. The distance of the additional sub-patterns from the additional target center may be the same as or different from both the first and second distances. The sub-patterns of the additional target pattern are substantially non-overlapping with the sub-patterns of the first and second target patterns. The method then includes determining the center of the additional target pattern and measuring positioning error between the lithographic fields by comparing locations of the first, second and additional target pattern centers.

The method may also include determining the center of each sub-pattern, and using the center of the sub-patterns to determine the center of each of the target patterns.

The method may further include creating on the same lithographic level, or on a different lithographic level, a pattern central to a target pattern of the lithographic level, with the central pattern being different from the sub-patterns. The method then includes identifying the central pattern prior to determining the centers of the first and second target patterns.

The method may also include providing at least one additional target pattern on a same or different lithographic level as the first or second target pattern, with the additional target pattern overlying the first and second target patterns. The at least one additional target pattern comprises a plurality of sub-patterns symmetric about an additional target pattern center and at a same distance from an additional target pattern center. The additional target pattern center is intended to be at the same location as the first and second target pattern centers. The distance of the additional sub-patterns from the additional target center is the same as or different from both the first and second distances. The sub-patterns of the additional target pattern are substantially non-overlapping with the sub-patterns of the first and second target patterns. The method then includes using pattern recognition software, capturing an image of the additional pattern; determining centers of the sub-patterns of the additional target pattern; identifying the sub-patterns belonging to the additional target pattern; using the centers of the sub-patterns belonging to the additional target pattern, determining the center of the additional target pattern; and measuring positioning error between the lithographic fields by comparing locations of the first, second and additional target pattern centers.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 3-11 of the drawings in which like numerals refer to like features of the invention.

To support improved overlay optimization and minimize the area required for overlay targets, it has been found that more than two sub-patterns should be included within a single target. Such multi-layer overlay targets provide benefits to the IC manufacturer such as simultaneous overlay measurement among multiple layers, improved overlay optimization across multiple layers, improved correlation of target metrology to within chip overlay, target area minimization, and common metrology recipe and sampling across multiple layers. The terms "lithographic layer" and "lithographic level" are used interchangeably herein.

The image field of view (FOV) can accommodate multiple instance of any suitably small sub-pattern. To achieve optimized metrology performance at maximum packing density for current overlay tooling; however, it is desirable to have an array layout that most efficiently utilizes the FOV. Such an array layout should also have a common center for all layers eliminating the need for layer to layer calibration and radial symmetry minimizes the distorting effects of metrology tool lens aberrations. A 90/180/270 degree rotation invariance allows flexibility in placing target groups around the chip. The array layout should also maximize the distance among sub-patterns, minimize asymmetric proximity effects, and use sub-patterns that are designed for optimum nesting and process compatibility. Central pattern recognition is also desirable, as it enables precise target centering in the FOV, so that the full FOV can be utilized.

The target system of the present invention places a plurality of sub-patterns at a constant radial distance about a common center, such that the sub-patterns are symmetric about a target pattern center and preferably define the corners of a geometric shape, more preferably a square. Other geometric shapes may also be used, with the sub-patterns located at the corners of the shapes. The sub-patterns can be any feature or combination of features that is symmetric about the x-y axes, such as a cross, circle, square, square grid, and the like. The cross is the simplest among the sub-pattern options.

Figure 3:
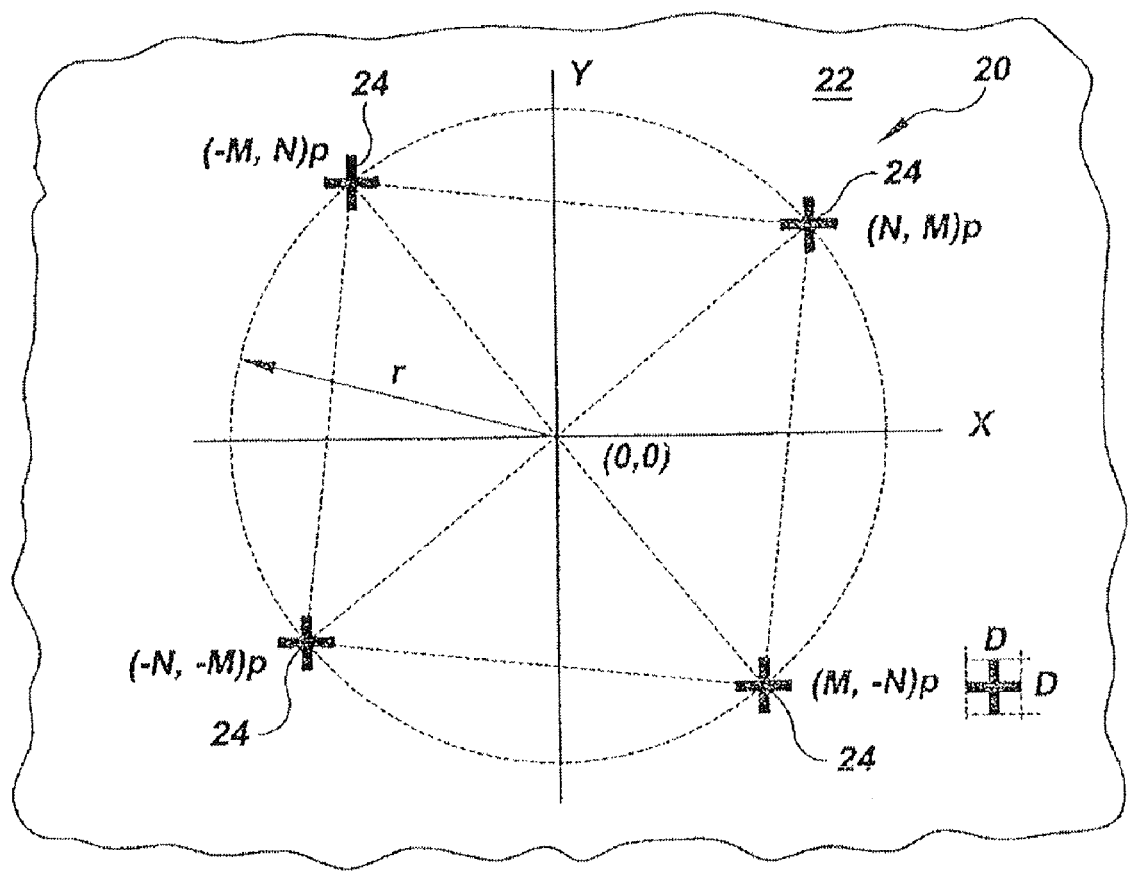
FIG. 3 is a top plan view of the layout of one embodiment of sub-patterns in a target pattern on a single lithographic layer.

As shown in FIG. 3, a one embodiment of a target pattern 20 in accordance with the present invention is shown on a single lithographic layer 22. In an actual wafer production, lithographic level 22 contains an integrated circuit field (not shown), and target pattern 20 is located in an inactive area of the wafer either within the chip boundary or in the kerf region. Target pattern 20 forms a square superimposed over a regular orthogonal grid of pitch p. Sub-patterns 24 comprise crosses located at the corners of the square whose center is at the origin of the x- and y-axes. The length of the line segments making up the sub-pattern crosses is shown as dimension D. The x-y location of each sub-pattern from the center (0, 0) of the square are integer multiples (N, M) of p. The centers of the sub-patterns are located at a distance, radius r, from the center of the target pattern:

$$r = p\sqrt{(N^2 + M^2)}$$

Figure 4:
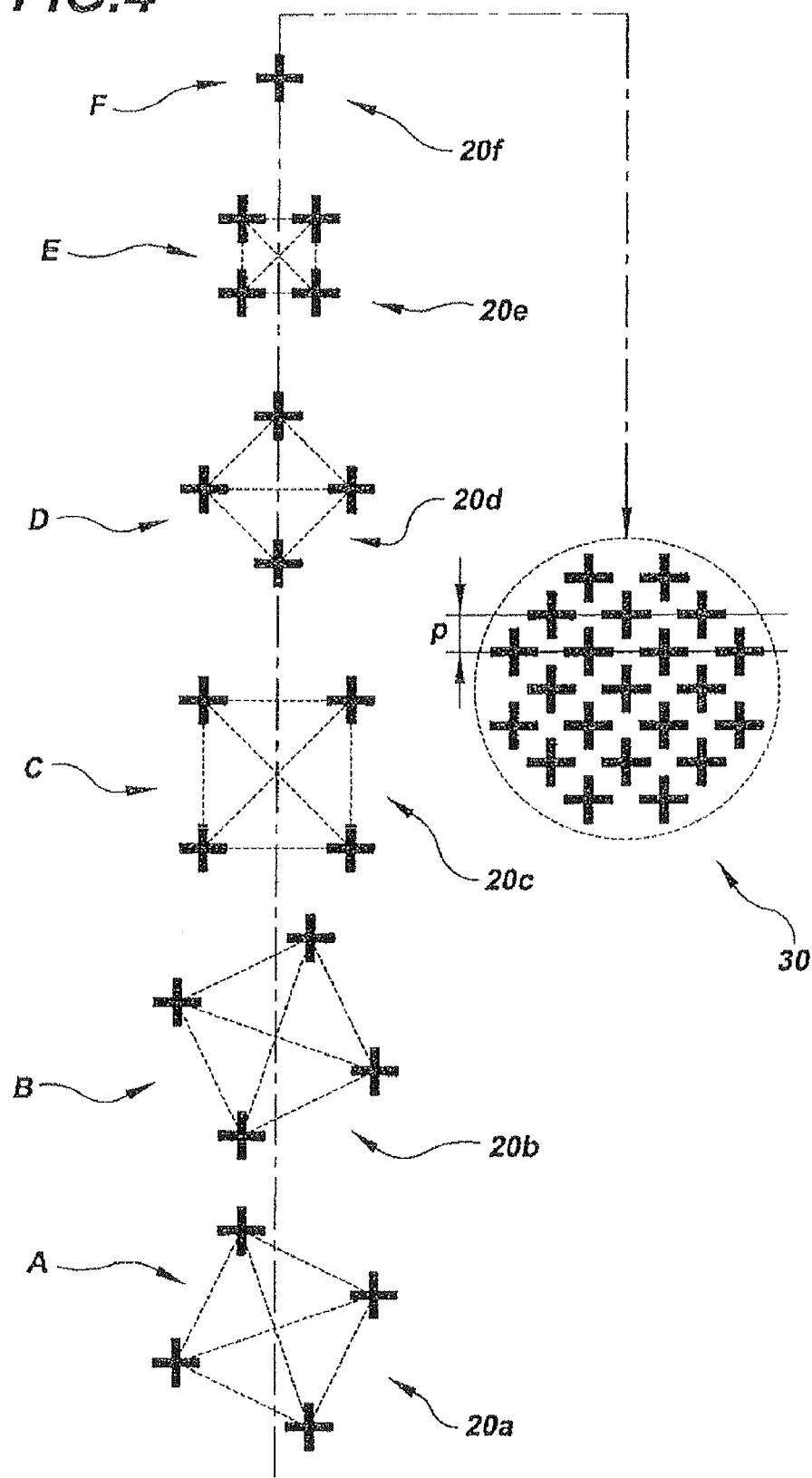
FIG. 4 is a top plan view of the layout of target patterns of the type shown in FIG. 3 used on successive lithographic layers A through F.

As the targets are created on each of the different lithographic layers containing the other portions of the integrated circuit, the (N, M) values are incremented by integers (n, m). Each layer corresponds to unique values of (N, M). Radial symmetry of the target is maintained at each layer. The radii of the sub-patterns may be the same or different for each lithographic layer and the centers of the sub-patterns of each target on each layer define a unique radius for the target on a layer. Under the constraint that the sum of the absolute values of the increments are even, i.e, $$|n| + |m| = 2i$$

for integer i, superposition of the sub-patterns over multiple layers defines an overlay target in the form of a close-packed diagonal array. As shown in FIG. 4, target patterns 20a, 20b, 20c, 20d, 20e and 20f are formed on lithographic layers A, B, C, D, E and F, respectively. The targets of layers A through E are formed in a square pattern as describe above; the target of layer F is a single sub-pattern cross at the center of the overlaid array of targets. The individual targets 20a, 20b, 20c, 20d, 20e and 20f are located on their respective layers so that they would all have the same center location if the layers were perfectly aligned. Instead of being located on different layers, some of the targets may be overlaid or "stitched" together from different patterns in different fields lithographically formed on the same layer. Each of the target patterns 20a, 20b, 20c, 20d, and 20e is incremented from the one preceding it in the manner described above. After the successive lithographic layers are formed over one another, the target patterns are overlaid on one another as shown by combined target pattern array 30. The cross sub-patterns do not overlap in the array provided the cross dimension D<2p.

The preferred layer alignment measurement method consists of determining the center of each printed sub-pattern, using those sub-pattern centers to determine the center of the square defined by the four sub-pattern centers at each layer, and then determining the pair-wise difference in x and y values among the centers of all of the squares to determine alignment error between the integrated circuit fields on the different lithographic levels.

Figure 5:
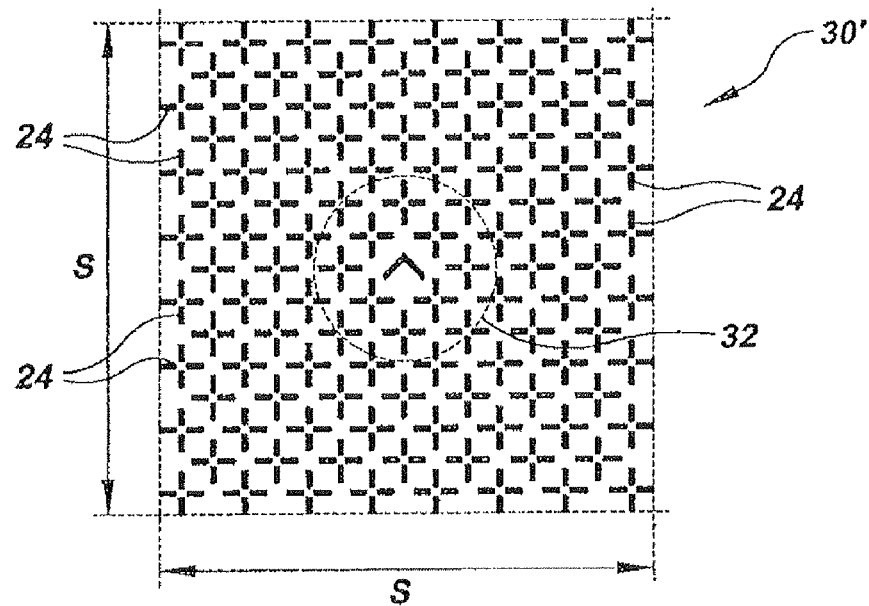
FIG. 5 is a top plan view of overlapped target patterns of the type shown in FIG. 3 on 28 successive lithographic layers.
Figure 6:
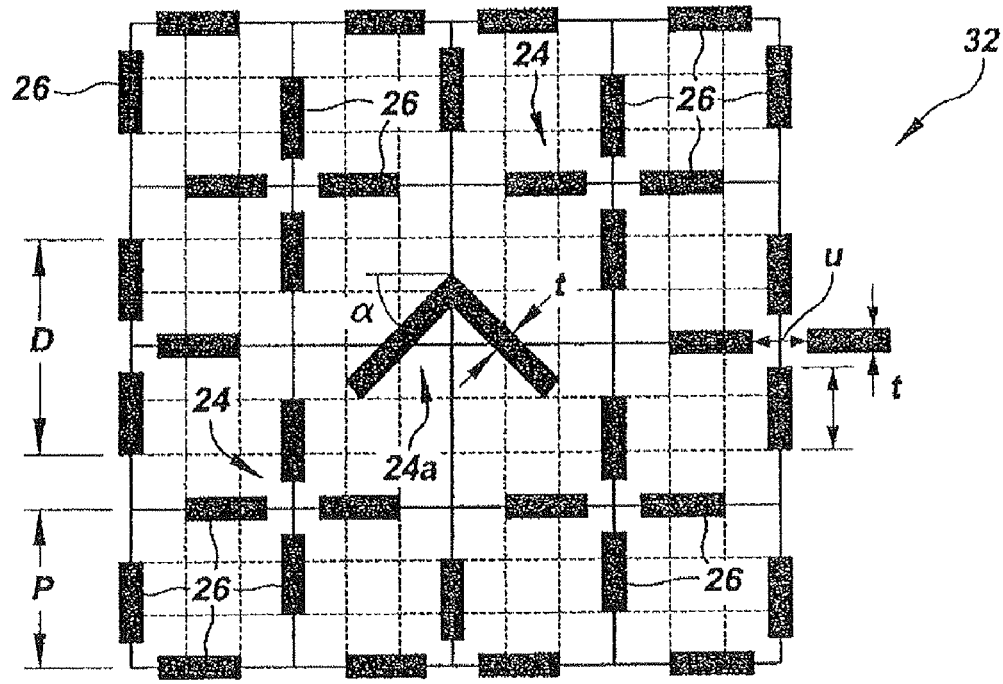
FIG. 6 is a close-up view showing detail of the central portion of the overlapped target patterns of FIG. 5.

An embodiment of a fully populated overlay target array 30' with side dimension S of 46 μm is shown in FIG. 5. Target array 30' is designed to fit within a 50 μm square FOV, and a detailed view of the target center 32 is shown in FIG. 6. Individual cross shaped sub-patterns have arm 26 widths t of 0.5 μm, and central opening spacing u of 1.0 μm. For pitch p of 3 μm and sub-pattern height and width D of 4 μm, 28 layers are shown represented within the single target array 30'. A chevron-shape sub-pattern 24a with arms at an angle α of 45° marks the center of target array 30' to provide a pattern recognition mark distinguishable from the surrounding sub-pattern crosses. Center sub-pattern 24a may be formed on one of the layers having a target pattern, or on a different layer.

Figure 7:
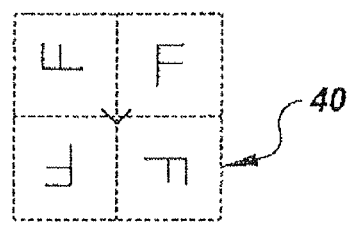
FIG. 7 is a top plan view showing the rotation of a target pattern in one quadrant by increments of 90 degrees.
Figure 8:
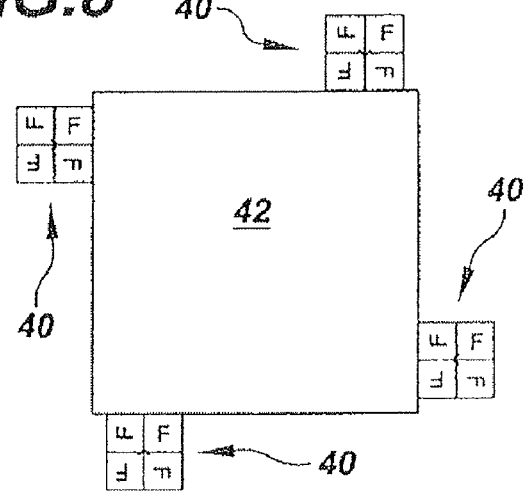
FIG. 8 is a top plan view of showing a group of targets rotated in increments of 90 degrees on all four sides of a rectangular circuit.

With the exception of the pattern recognition chevron, the target of FIG. 5 is invariant to rotation in increments of 90 degrees. This facilitates both the target design and target placement around the perimeter of the circuit. The target design requires layout of only one quadrant of the target. The three additional quadrants are then created by rotating the first quadrant in increments of 90 degrees, as shown in FIG. 7, where the letter "F" represents the orientation of quadrant of target group 40. Furthermore, a group of targets 40 representing the entire set of possible pattern layers can be designed in one orientation to fit within the kerf on one side of the rectangular circuit area 42 and rotated in increments of 90 degrees for placement on the other three sides of the circuit, as shown in FIG. 8. That the pattern recognition chevron in the center of each of the target groups then serves as an arrow pointing to the circuit, thus providing a useful indicator during overlay recipe build.

Central pattern recognition enables the most robust image capture and centering by otherwise conventional optical pattern recognition software. Using optical pattern recognition software, one would first center and capture the image of the overlaid target array. From that image, one would then determine sub-pattern (cross) centers using conventional threshold or correlation algorithms operating on the images of each sub-pattern. Using the sub-pattern centers, one would then determine, based on the known layout and layer identification (maintained in a database that is accessible at the time of measurement), which sub-patterns define each target pattern on a lithographic field or layer, and then determine the target pattern shape (square) centers for each lithographic field or layer. Using the center locations for each target pattern on each field or layer, one would then determine pair-wise differences among shape (square) centers, i.e., alignment or overlay error between each adjacent field or layer. The center locations of the sub-patterns that define the apices of the target shape also enable determination of the deviation of each shape from its nominal dimensions. This serves as a useful metrology and process diagnostic.

Figure 9A:
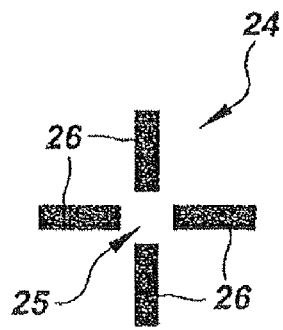
FIGS. 9a, 9b and 9c show alternate embodiments of sub-patterns that may be used in the present invention.
Figure 9B:
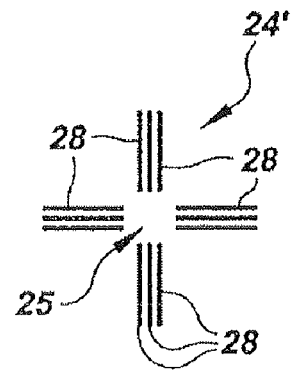
Figure 9C:
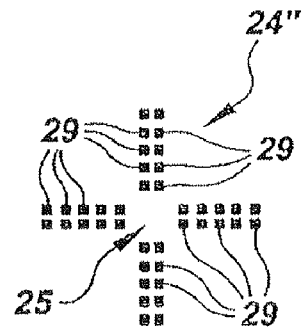

To improve process compatibility the center of each cross sub-pattern 24 is not patterned, and consists of arms 26 extending away from an open center 25, as shown in FIG. 9a. The target sub-patterns may also be comprised of smaller, ground-rule compatible elements as illustrated by spaced parallel lines 28 forming the cross arms of sub-pattern 24' in FIG. 9b, and the spaced contacts or posts 29 forming the cross arms of sub-pattern 24" in FIG. 9c.

In general, the maximum value of the integer indices within a square FOV of dimension S is given by:

$$N_{max}=M_{max}\leq(S/2p)-1$$

Figure 1:
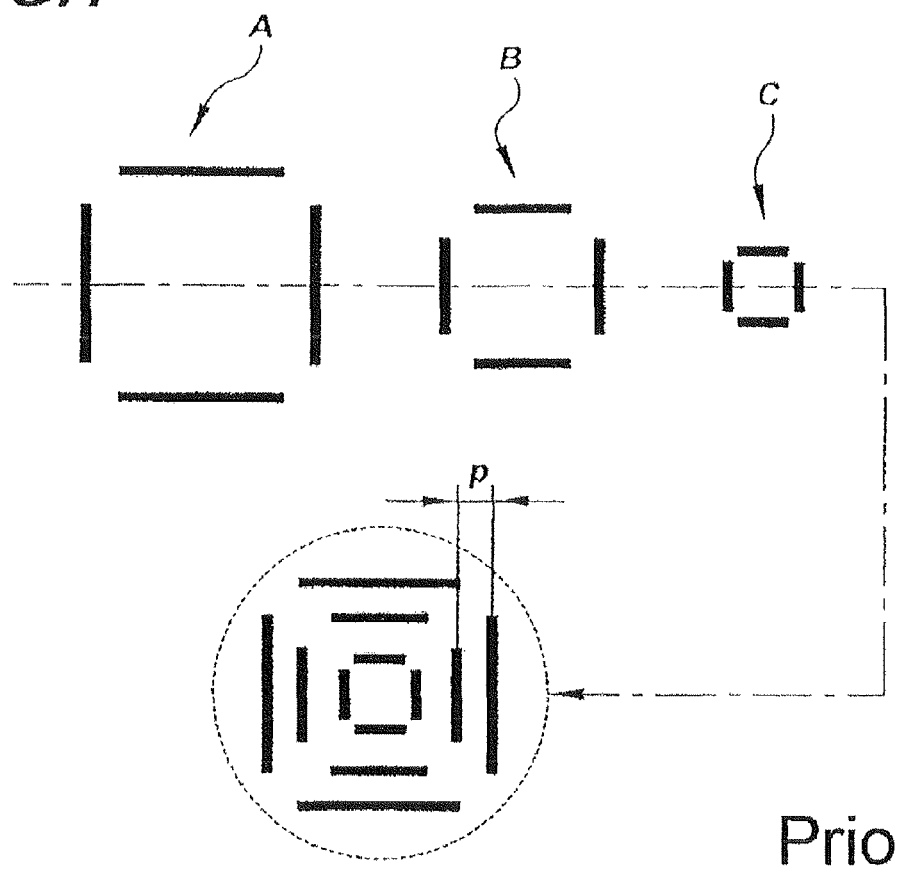
FIG. 1 is a top plan view of the sequencing of nested targets on successive lithographic layers in the prior art.
Figure 2:
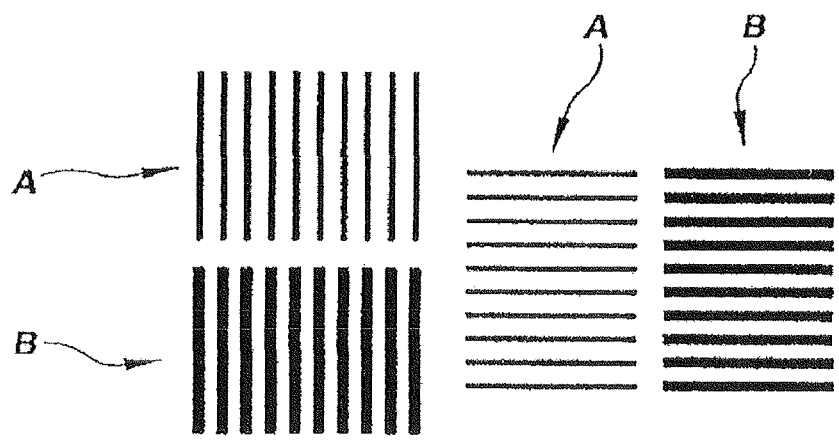
FIG. 2 is a top plan view of the use of grating targets on successive lithographic layers in the prior art.

An important measure of the target effectiveness is the number of layers that can be represented within a single target, $L_{max}$. For the conventional nested frame target of FIG. 1, $L_{max}=N_{max}$ increases only linearly with the ratio $S/2p$, so that $L_{max}=7$ for the same FOV and pitch as the $L_{max}=28$ target of FIG. 5. In other words, the present invention permits a target of a given size to determine the alignment of 28 layers, as opposed to only seven layers using the prior art target of FIG. 1. For the target system of the present invention, the maximum number of layers $L_{max}$ is given by:

$$L_{max}=(N_{max}/2)(N_{max}+1)$$

Thus, $L_{max}>N_{max}$ increases quadratically with the ratio $S/2p$. For example, using $p=2.5$ μm while maintaining $S=50$ μm allows Lmax to equal 45.

The multi-layer target system of the present invention enables rapid and robust optimization of overlay metrology throughout the lithographic manufacturing process. The ability to determine alignment of 25 to 50 layers enables overlay metrology through the entire circuit manufacturing process to be conducted using a single target, thereby reducing the required target area by a factor greater than 20. Furthermore, having a single target reduces the number of metrology tool recipes required by the same factor, while enforcing a common sampling across all layers. In turn, by sustaining a fixed set of measurement locations, common sampling simplifies the task of correlating the overlay error measured in the kerf to errors observed within the chip.

Figure 10:
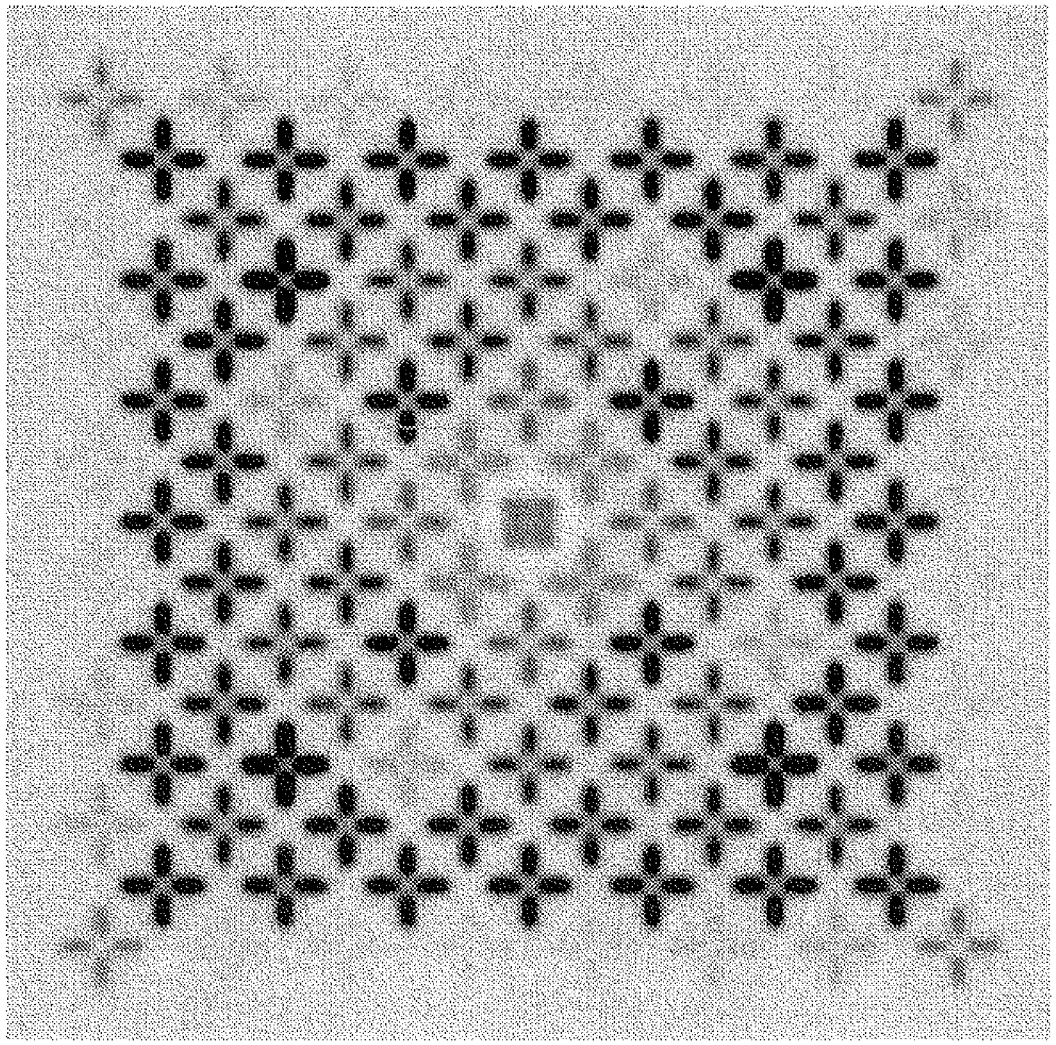
FIG. 10 is a photomicrograph of a simulated metrology tool image of a 28-layer target, of the type shown in FIG. 5.

A simulation of a 28 layer target using the FIG. 5 target imaged in a metrology tool using broadband illumination (400-700 nm) and a 0.5 numerical aperture is shown in FIG. 10. In this case the pattern recognition mark in the target center is a square rather than a chevron.

While a typical chip utilizes about 20 masking layers, a manufacturing technology may allow on the order of 100 layers for the customization of specific chips. The proposed target must accommodate all of these layers. Since an individual target of the design shown in FIG. 5 accommodates 28 layers (FIG. 10), three or four such targets are required to accommodate the full set of layers for a given manufacturing technology. The method of assigning layer locations among and within the targets can be captured in a set of layer assignment guidelines, as follows:

Among targets: Group layers by their sequential order. Front-end process layers, e.g., shallow trench isolation (STI), poly gate, and implants, can be grouped in a first set of one or more targets. Back-end interconnect and via layers can be grouped in a second set of one or more targets. Front-end to back-end transition layers should appear in a pair of targets; namely, the layer to which the back end aligns should be in both the front-end and back-end targets.

Figure 11:
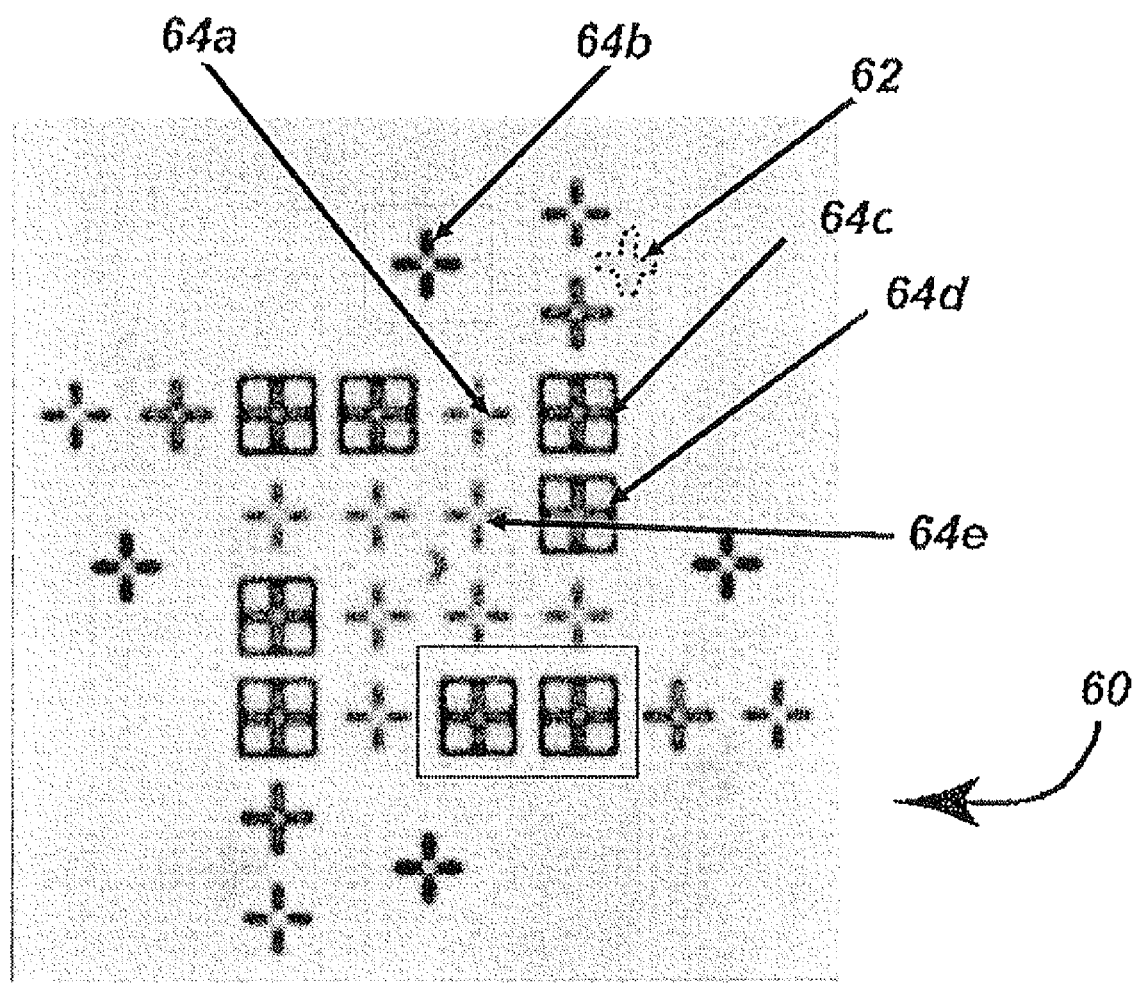
FIG. 11 is a photomicrograph of an actual metrology tool image of a 28-layer target at a post-gate implant layer.

Within targets: Positioning of each set of layer sub-patterns or marks within a given target need not be sequential. In the front-end target, implanted patterns are typically not detectable by alignment systems or overlay tools; so, to minimize proximity effects, it is advisable to use implant layers as spacers between etched layers. Implants whose energy is sufficiently low not to leave discernable patterns post resist strip can be stacked in the same location. The image of an actual 28-layer target 60 at a post-gate implant layer is shown in FIG. 11. The current layer implant mark 64b is clearly visible. The previous high energy implant mark 62 is barely visible (shown with added phantom lines), whereas all of the previous etched layers 64a, 64c, 64d, and 64e are clearly visible. None of the previous low-energy implant marks are visible. The STI layer mark 64e and gate layer mark 64d include marks 64a and 64c, respectively, overlaid or stitched from patterns on adjacent fields on the same respective layer to monitor and control within-layer field shape.

The principles of the inventive target design apply to both alignment and overlay targets. Given alignment system and overlay metrology tool compatibility, the same target can be used for both purposes.

Thus, the present invention achieves the goals and objects described above. It provides an improved method and target system for determining overlay or alignment error between different fields in the same lithographic level or among the many lithographic levels required to create an integrated circuit. The multi-field or level lithographic target system described herein efficiently utilizes the field of view of the metrology tool, uses a minimum amount of wafer surface area, and uses a common metrology recipe and sampling across multiple layers. The array layout's common center for all layers is recognizable by optical pattern recognition, enables precise target centering in the FOV, eliminates the need for layer to layer calibration and its radial symmetry minimizes the distorting effects of metrology tool lens aberrations. Moreover, the 90/180/270 degree rotation invariance allows flexibility in placing target groups around the chip, and the array layout maximizes the distance among sub-patterns, minimizes asymmetric proximity effects, and uses sub-patterns that are designed for optimum nesting and process compatibility.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of determining positioning error between lithographically produced integrated circuit fields on at least one lithographic level comprising:

creating a first target pattern on a first lithographic field containing an integrated circuit pattern, the first target pattern comprising a plurality of sub-patterns symmetric about a first target pattern center and at a same first distance from the first target pattern center;

creating a second target pattern on a second lithographic field that is different than the first lithographic field and containing an integrated circuit pattern, the second target pattern comprising a plurality of sub-patterns symmetric about a second target pattern center and at a same second distance from the second target pattern center, the second target pattern center intended to be at the same location as the first target pattern center, the second distance being the same or different than the first distance and the plurality of sub-patterns of the second target pattern being substantially non-overlapping with the plurality of sub-patterns of the first target pattern; and measuring positioning error between the first lithographic field and the second lithographic field using the first target pattern and the second target pattern, wherein the plurality of sub-patterns of the first target pattern and the second target pattern form cross shapes that are located at corners of a geometric shape.

2. The method of claim 1, wherein using the first target pattern and the second target pattern comprises determining a first location of the first target pattern center and a second location of the second target pattern center and comparing the first location and the second location.

3. The method of claim 1, wherein the first lithographic field and the second lithographic field are on a same lithographic level.

4. The method of claim 1, wherein the first lithographic field and the second lithographic field are on different lithographic levels.

5. The method of claim 1, wherein the geometric shape is a square.

6. The method of claim 1, further comprising determining a center of each of the plurality of sub-patterns of the first and second target patterns, wherein using the first target pattern and the second target pattern comprises using the center of each of the plurality of sub-patterns of the first and second target patterns.

7. The method of claim 1, wherein the cross shapes have an open center.

8. The method of claim 1, wherein each of the plurality of sub-patterns of the first and second target patterns comprise elements symmetric about x- and y-axes.

9. The method of claim 8, wherein each element comprises a plurality of sub-elements.

10. A target system on a lithographic field of a wafer for determining positioning error between lithographically produced integrated circuit fields on at least one lithographic level of the wafer comprising:

a first target pattern on a first lithographic field containing an integrated circuit pattern, the first target pattern comprising a plurality of sub-patterns symmetric about a first target pattern center, located solely at corners of a geometric shape and at a same first distance from the first target pattern center; and a second target pattern on a second lithographic field that is different than the first lithographic field containing an integrated circuit pattern, the second target pattern comprising a plurality of sub-patterns symmetric about a second target pattern center, located solely at corners of a geometric shape and at a same second distance from the second target center, the second target pattern center intended to be at the same location as the first target pattern center, the second distance being the same or different than the first distance and the plurality of sub-patterns of the second target pattern being substantially non-overlapping with the plurality of sub-patterns of the first target pattern, differences in locations of centers of the sub-patterns of the first and second target patterns indicating positioning error between the first lithographic field and the second lithographic field.

11. The target system of claim 10, wherein the first lithographic field and the second lithographic field are on a same lithographic level.

12. The target system of claim 10, wherein the first lithographic field and the second lithographic field are on different lithographic levels.

13. The target system of claim 10, wherein the geometric shapes are squares.

14. The target system of claim 10, wherein each of the plurality of sub-patterns of the first and second target patterns comprise elements symmetric about x- and y-axes.

15. The target system of claim 14, wherein each element comprises a plurality of sub-elements.

16. A target system on a lithographic field of a wafer for determining positioning error between lithographically produced integrated circuit fields on at least one lithographic level of the wafer comprising:

a first target pattern on a first lithographic field containing an integrated circuit pattern, the first target pattern comprising a plurality of sub-patterns symmetric about a first target pattern center, located solely at corners of a geometric shape and at a same first distance from the first target pattern center; and a second target pattern on a second lithographic field that is different than the first lithographic field containing an integrated circuit pattern, the second target pattern comprising a plurality of sub-patterns symmetric about a second target pattern center, located solely at corners of a geometric shape and at a same second distance from the second target center, the second target pattern center intended to be at the same location as the first target pattern center, the second distance being the same or different than the first distance and the plurality of sub-patterns of the second target pattern being substantially non-overlapping with the plurality of sub-patterns of the first target pattern, wherein based on locations of centers of the sub-patterns of the first and second target patterns differences in said positions of the centers of the sub-patterns of the first and second patterns indicate positioning error between the first lithographic field and the second lithographic field wherein each of the plurality of sub-patterns of the first and second target patterns forms a cross shape.

17. The target system of claim 16, wherein each cross shape has an open center.

18. A method of determining positioning error between lithographically produced integrated circuit fields on at least one lithographic level comprising:

creating a first target pattern on a first lithographic field containing an integrated circuit pattern, the first target pattern comprising a plurality of sub-patterns symmetric about a first target pattern center and at a same first distance from the first target pattern center;

creating a second target pattern on a second lithographic field that is different than the first lithographic field and containing an integrated circuit pattern, the second target pattern comprising a plurality of sub-patterns symmetric about a second target pattern center and at a same second distance from the second target pattern center, the second target pattern center intended to be at the same location as the first target pattern center, the second distance being the same or different than the first distance and the plurality of sub-patterns of the second target pattern being substantially non-overlapping with the plurality of sub-patterns of the first target pattern; and determining locations of centers of each of the sub-patterns of the first and second target patterns; and determining centers of the first and second target patterns;

measuring positioning error between the first lithographic field and the second lithographic field using the determined centers of each of the sub-patterns of the first and second target patterns and of the first and second target patterns;

wherein the plurality of sub-patterns of the first target pattern and the second target pattern are each located only at corners of a geometric shape that has at least two corners.

19. The method of 18, wherein the first lithographic field and second lithographic field arrangement is such that the first target pattern is positioned on a first layer above the second target pattern which is on a successive layer to the first layer, the first target pattern's center being coincident with the second target pattern's center, thereby reducing space required for substrate shift analysis.

* * * * *